(12) United States Patent
Zhang et al.

(10) Patent No.: US 11,606,102 B2
(45) Date of Patent: Mar. 14, 2023

(54) SIGMA DELTA MODULATOR AND METHOD THEREFOR

(71) Applicant: NXP B.V., Eindhoven (NL)

(72) Inventors: Chenming Zhang, Eindhoven (NL);
Marcello Ganzerli, Eindhoven (NL);
Pierluigi Cenci, Eindhoven (NL);
Lucien Johannes Breems, Waalre (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/449,030

(22) Filed: Sep. 27, 2021

(65) Prior Publication Data

US 2022/0416809 A1  Dec. 29, 2022

(30) Foreign Application Priority Data

Jun. 28, 2021 (CN) .......................... 202110722726.6

(51) Int. Cl.
*H03M 3/00* (2006.01)

(52) U.S. Cl.
CPC ............. *H03M 3/454* (2013.01); *H03M 3/34* (2013.01); *H03M 3/504* (2013.01)

(58) Field of Classification Search
CPC ......... H03M 3/34; H03M 3/454; H03M 3/504
See application file for complete search history.

(56) References Cited

U.S. PATENT DOCUMENTS

| | | | | |
|---|---|---|---|---|
| 6,104,844 A | * | 8/2000 | Alger-Meunier | H04N 5/3745 348/E3.02 |
| 6,998,910 B2 | * | 2/2006 | Hezar | H03F 3/217 330/10 |
| 7,193,545 B2 | | 3/2007 | Morrow et al. | |
| 7,248,186 B1 | * | 7/2007 | Duewer | H04L 25/028 713/400 |
| 10,998,917 B1 | * | 5/2021 | Singh | H03M 3/49 |
| 2008/0159365 A1 | * | 7/2008 | Dubocanin | H03F 3/45475 330/109 |

(Continued)

OTHER PUBLICATIONS

Billa, S., "Analysis and Design of Continuous-Time Delta-Sigma Converters Incorporating Chopping", IEEE Journal of Solid-State Circuits, vol. 52, No. 9, Sep. 2017.

(Continued)

*Primary Examiner* — Lam T Mai

(57) ABSTRACT

A sigma delta modulator comprises an input configured to receive an input analog signal; a summing junction configured to subtract a feedback analog signal from the input analog signal; a first stage including a low pass filter coupled to the summing junction, wherein the low pass filter is configured to generate a first filtered signal; a second stage coupled to the low pass filter, configured to generate a second filtered signal by an active filter; a back-end stage coupled to the second stage, wherein the back-end stage comprises an analog to digital converter configured to convert the $2^{nd}$ filtered signal to a digital output signal by sampling at a predetermined sampling frequency (fs); and a feedback path for routing the digital output signal to the summing junction, wherein the feedback path comprises a digital to analog converters, DAC, converting the digital output signal to the feedback analog signal.

20 Claims, 18 Drawing Sheets

(56) References Cited

U.S. PATENT DOCUMENTS

2017/0019123 A1\* 1/2017 Choi ................. H03M 3/422

OTHER PUBLICATIONS

Chae, H., "A 12 mW Low Power Continuous-Time Bandpass ΔΣ Modulator With 58 dB SNDR and 24 MHz Bandwidth at 200 MHz IF", IEEE Journal of Solid-State Circuits, vol. 49, No. 2, Feb. 2014.
Zeller, S., "A0.039mm Inverter-Based 1.82mW68.6 dB-SNDR 10 MHz-BW CT-—ADC in 65 nm CMOS Using Power- and Area-Efficient Design Techniques", IEEE Journal of Solid-State Circuits, vol. 49, No. 7, Jul. 2014.
Bai, W., "A 0.8-V 1. 7-μ W25.9-fJ Continuous-Time SigmaDelta Modulator for Biomedical Applications", 2016 IEEE Biomedical Circuits and Systems Conference (BioCAS), Oct. 1, 2016.
Enz, C., "Circuit Techniques for Reducing the Effects of Op-Amp Imperfections: Autozeroing, Correlated Double Sampling, and Chopper Stabilization", Proceedings of the IEEE, vol. 84, No. II, Nov. 1996.
Vercaemer, D., "Passive Loop Filter Assistance for CTSDMs", IEEE Transactions on Circuits and Systems-ll: Express Briefs, vol. 64, No. Oct. 2017.

\* cited by examiner

SIGMA DELTA MODULATOR AND METHOD THEREFOR

CROSS-REFERENCE TO RELATED APPLICATIONS

This application claims the priority under 35 U.S.C. § 119 of China application no. 202110722726.6, filed on 28 Jun. 2021, the contents of which are incorporated by reference herein.

BACKGROUND

The present application is generally directed to sigma-delta converters, and particularly to continuous-time sigma-delta analog-to-digital converters (ADCs) based on sigma delta modulation, and more particularly to sigma delta modulators (SDMs) with low pass filters and chopper stabilized amplifier for low flicker noise and high linearity.

Many applications require continuous-time Sigma-Delta ADCs with broad signal bandwidth, high dynamic range and high linearity, such as automotive radar. In continuous-time Sigma-Delta ADCs, there are two types of noise sources, namely, output stage noise sources and input stage noise sources. The output stage noise sources, for example, may include quantization noise. The input stage noise sources, for example, may include flicker noise. Flicker noise may depend on a 1/f relationship such that lower frequencies tend to contribute more to the flicker noise.

Some applications require the ADCs to have very low noise density at very low frequency (Hz to KHz range). For example, the flicker noise problem is a significant issue with circuits fabricated with deep-submicron CMOS devices. One approach for reducing flicker noise is to increase the size of the transistors. However, this may reduce the speed and increase area and power, which may be not possible or not power-efficient or area-efficient for the broadband ADCs. Another approach for addressing the flicker noise is to chop the signal at the operational amplifier to modulate the flicker noise out of the signal band of interest. But continuous-time SDMs using conventional chopping techniques cannot achieve broadband operation, high dynamic range and high linearity at the same time.

Therefore, there remains a need for a SDM which can enable broadband operation with low flicker noise and high linearity.

SUMMARY

This summary is provided to introduce a selection of concepts in a simplified form that are further described below in the Detailed Description. This summary is not intended to be relied on to identify key features or essential features of the claimed subject matter, nor is it intended to be used to limit the scope of the claimed subject matter.

According to a first aspect, there is a sigma delta modulator, comprising:
an input configured to receive an input analog signal;
a summing junction configured to subtract a feedback analog signal from the input analog signal;
a first stage including a low pass filter coupled to the summing junction, wherein the low pass filter is configured to generate a first filtered signal;
a second stage coupled to the low pass filter, configured to generate a second filtered signal by an active filter, wherein the active filter comprises at least one chopper stabilized amplifier where the first filtered signal is chopped at a chopping frequency which is 1/N times of the predetermined sampling frequency (fs);
a back-end stage coupled to the second stage, wherein the back-end stage comprises an analog to digital converter configured to convert the second filtered signal to a digital output signal by sampling at a predetermined sampling frequency (fs); and
a feedback path for routing the digital output signal to the summing junction, wherein the feedback path comprises digital to analog converters, DACs, converting the digital output signal to the feedback analog signal.

In some embodiments, the low pass filter is a passive low pass filter.

In some embodiments, the sigma delta modulator further comprises a high pass filter coupled between the second stage and the back-end stage.

In some embodiments, the sigma delta modulator further comprising a high pass filter included in the back-end stage.

In some embodiments, the second stage includes a single-OpAmp resonator.

In some embodiments, the second stage further comprises a first chopper, an amplifier and a second chopper, wherein the first chopper is coupled at the input of the amplifier and the second chopper is coupled at the output of the amplifier.

In some embodiments, the second stage further comprises a first chopper, a second chopper, a first amplifier and a second amplifier, wherein the first chopper is coupled at the input of the first amplifier and the second chopper is coupled between the first amplifier and the second amplifier.

In some embodiments, the second stage includes an integrator.

In some embodiments, the integrator further comprises a first chopper, an amplifier and a second chopper, wherein the first chopper is coupled at the input of the amplifier and the second chopper is coupled at the output of the amplifier.

In some embodiments, the integrator further comprises a first chopper, a second chopper, a first amplifier and a second amplifier, wherein the first chopper is coupled at the input of the first amplifier and the second chopper is coupled between the first amplifier and the second amplifier.

In some embodiments, the second stage further includes a first RC network coupled between the passive low pass filter and the amplifier, a second RC network coupled between the input of the amplifier and the output of the amplifier.

In some embodiments, the second stage further comprises a first chopper, an amplifier and a second chopper, wherein the first chopper is coupled at the input of the amplifier and the second chopper is coupled at the output of the amplifier.

In some embodiments, the second stage further comprises a first chopper, a second chopper, a first amplifier and a second amplifier, wherein the first chopper is coupled at the input of the first amplifier and the second chopper is coupled between the first amplifier and the second amplifier.

In some embodiments, the feedback digital to analog converters include a main digital to analog converter coupled to the summing junction and the passive low pass filter includes a resistor and a capacitor, wherein the resistor is coupled between the input of the sigma delta modulator and the output of the main digital to analog converter, and the capacitor is coupled between the output of the main digital to analog converter and the ground.

In some embodiments, the digital to analog converter is a finite impulse response (FIR) DAC.

According to a second aspect, there is a method for converting an analog input signal to a digital signal, the method comprising:

receiving an input analog signal;

subtracting a feedback analog signal from the input analog signal in a summing junction and generating a subtracted signal;

filtering subtracted signal to generate a first filtered signal by a low pass filter;

generating a second filtered signal by an active filter;

converting the second filtered signal to a digital output signal by sampling at the predetermined sampling frequency (fs);

feeding back the digital output signal to the summing junction via a digital-to-analog converter, DAC, converting the digital output signal to the feedback analog signal.

In some embodiments, the low pass filter is a passive low pass filter.

In some embodiments, the active filter is a single-OpAmp resonator.

In some embodiments, the method further comprising filtering the second filtered signal by a high pass filter.

In some embodiments, the method includes chopping the signal at at least one chopper stabilized amplifier of the active filter at a chopping frequency which is 1/N times of the predetermined sampling frequency (fs).

BRIEF DESCRIPTION OF THE DRAWINGS

So that the manner in which the above recited features of the present application can be understood in detail, a more particular description of the application, briefly summarized above, may be had by reference to embodiments, some of which are illustrated in the appended drawings. It is to be noted, however, that the appended drawings illustrate only typical embodiments of this application and are therefore not to be considered limiting of its scope, for the application may admit to other equally effective embodiments. The drawings are for facilitating an understanding of the application and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
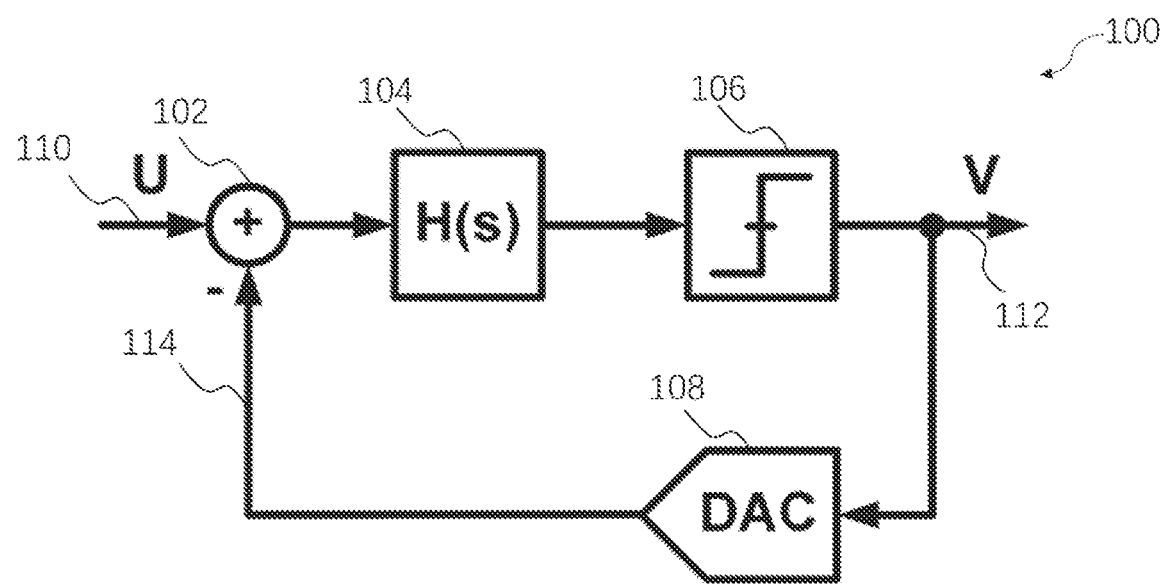
FIG. 1 illustrates a block diagram of a sigma-delta modulator.

Sigma-Delta ADCs contains one or multiple Sigma-Delta modulators (SDMs). A SDM is a feedback loop containing a loop filter, a quantizer, and one or more feedback DAC(s). FIG. 1 illustrates a block diagram of a continuous time SDM 100. The SDM 100 includes a summing junction 102, a loop filter (H(s)) 104, a quantizer or an analog-to-digital converter (ADC) 106, and a digital-to-analog converter (DAC) 108. The DAC 108 provides a feedback path 114 to summing junction 102 that is configured to receive an analog input and the output of the DAC 108.

An input U 110 is coupled to a positive input of the summing junction 102. The output of the summing junction 102 is coupled to an input of the loop filter 104. The output of the loop filter 104 is coupled to an input of the quantizer 106. An output of the quantizer 106 is the output V 112 of the sigma-delta modulator 100. In order to provide the feedback loop, the output of the quantizer 106 is also coupled to an input of the DAC 108. The output of the DAC 108 is coupled to a negative input of the summing junction 102 to provide a feedback signal. In this way, the DAC 108 is in the feedback path. The quantizer 106 and the DAC 108 may be both clocked by a clock signal that has a sampling frequency fs. Typically, the sampling frequency may be much higher than the minimum required Nyquist rate such that the sigma-delta modulator 100 is oversampled.

Figure 2:
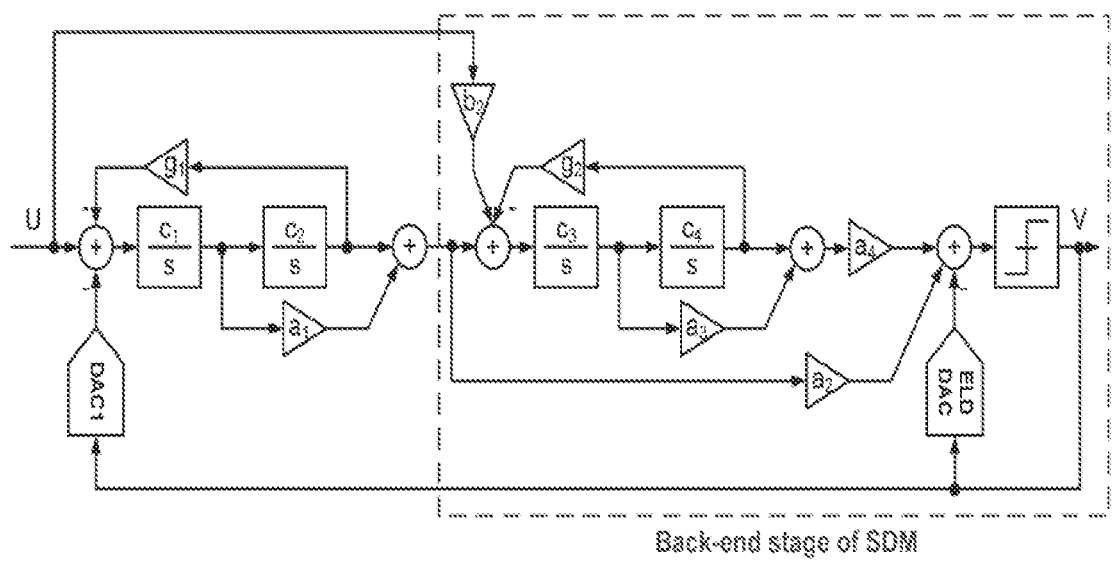
FIG. 2 illustrates a 4th order SDM with excess loop delay (ELD) compensation.
Figure 3:
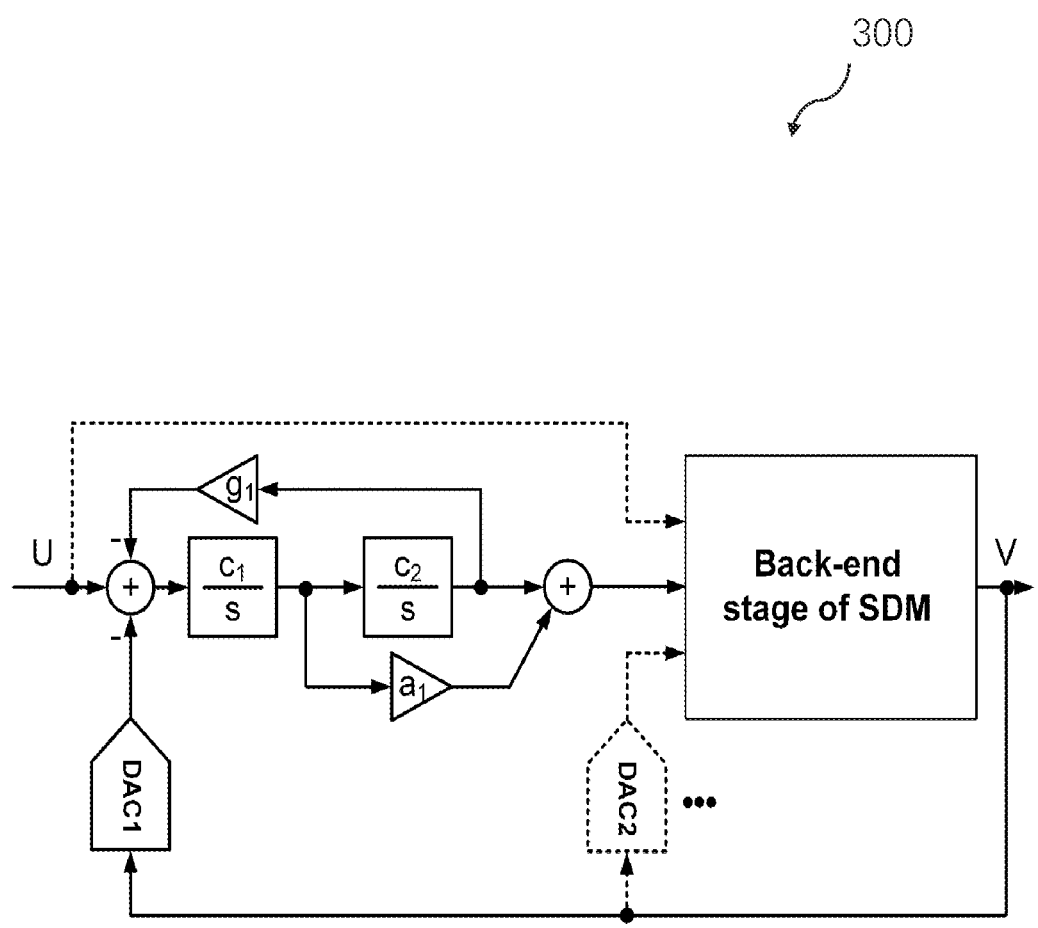
FIG. 3 illustrates a simplified figure of FIG. 2.

SDMs have various architecture with different loop filter order and topology, quantizer resolution, etc. The order of the loop filter determines the order of a continuous time SDM. For example, FIG. 2 shows a 4th order SDM 200 with the excess loop delay (ELD) compensation. For this application, a front-end stage includes a single-operation amplifier resonator, and a back-end stage of the SDM includes part of the loop filter and the quantizer. The flicker noise contributed by the back-end stage of the SDM (e.g. $C_3/s$, $C_4/s$), is suppressed by the gain of the front-end stage when referred to the SDM input node U. For flicker noise analysis, low frequency (up to a few MHz) is considered. At low frequency (up to a few MHz), typically the gain of the front-end stage is relatively high (typically more than 20 dB). If the flicker noise contributed by the back-end stage of the SDMs is suppressed by the gain of the front-end stage, then the flicker noise of the back-end stage is not dominant in the overall input-referred low-frequency noise. Thus, the input-referred flicker noise of the SDM is typically not limited by the flicker noise contributed by the back-end stages. Thus, for simplicity reason, in the following description, the back-end stage of the SDM is not shown in detail, and the exemplary SDM architecture 200 in FIG. 2 can be simplified as shown in FIG. 3.

Figure 4A:
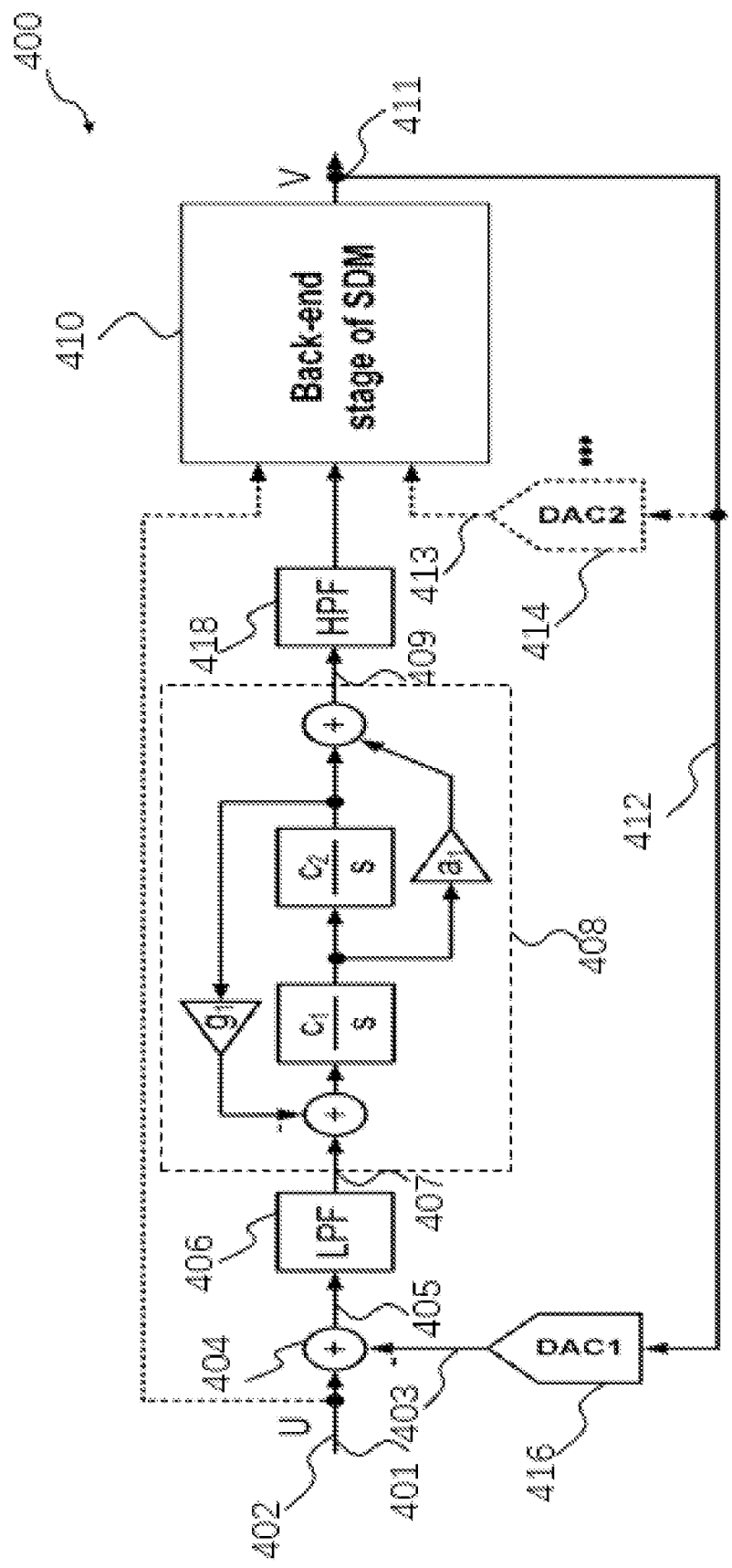
FIG. 4A illustrates an SDM architecture with a single-operation amplifier resonator, with a low pass filter and a high pass filter in accordance with an embodiment of the present application.

Referring now to FIG. 4A, a SDM architecture 400 with a low pass filter and a single-operational amplifier resonator according to some examples of the application, is illustrated. In this example, the SDM 400 includes an input 402, a summing junction 404, a first stage 406, a second stage 408, and a back-end stage 410. The input 402 is configured to receive an input analog signal U 401. The summing junction 404 is configured to subtract a feedback signal 403 from the input analog signal 401 and generate a first output signal 405. The first stage 406 includes a low pass filter which is coupled to the output of the summing junction 404. The first stage 406 is configured to filter the first output signal 405 and generate a first filtered signal 407. For example and without limitation, for a SDM operating with a sampling frequency of 40 MHz and the LPF may have a pole frequency higher than 40 MHz. The second stage 408 may include a single-operational amplifier resonator coupled to the output of the low pass filter, which is configured to chop the first filtered signal at at least one chopper stabilized amplifier and generate a second filtered signal 409. The back-end stage 410 may include a quantizer or an analog to digital converter (DAC) coupled to the output of the second stage 408, configured to convert the second filtered signal 409 to a digital output signal 411. A feedback path 412 comprises a plurality of digital to analog converters configured to convert the digital output signal to analog forms. The feedback path is for routing the digital output signal to the summing junction. The digital output signal 411 is fed back to a main DAC 416 through the feedback path to generate the feedback analog signal 403. The digital output signal 411 may also be fed back to a second feedback DAC 414 to generate a second feedback signal 413 to be input to the backend stage 410.

In one embodiment, the low-pass filter may be a passive low-pass filter. In the present context, "passive" means that the filter is comprised of only impedances (resistances, capacitances and/or inductances; in contrast, "active" means comprising at least one amplifier, transistor or other semiconductor-based component). In this manner, the first stage including the passive low-pass filter may achieve a broadband filtering of the high-frequency quantization noise and spurs, and it doesn't contribute to flicker noise because it is passive. The low-pass filter is not limited to a passive low-pass filter. The low-pass filter may be an active low-pass filter. In this manner, the flicker noise generated by the active low-pass filter may be reduced by the following second stage.

Figure 5:
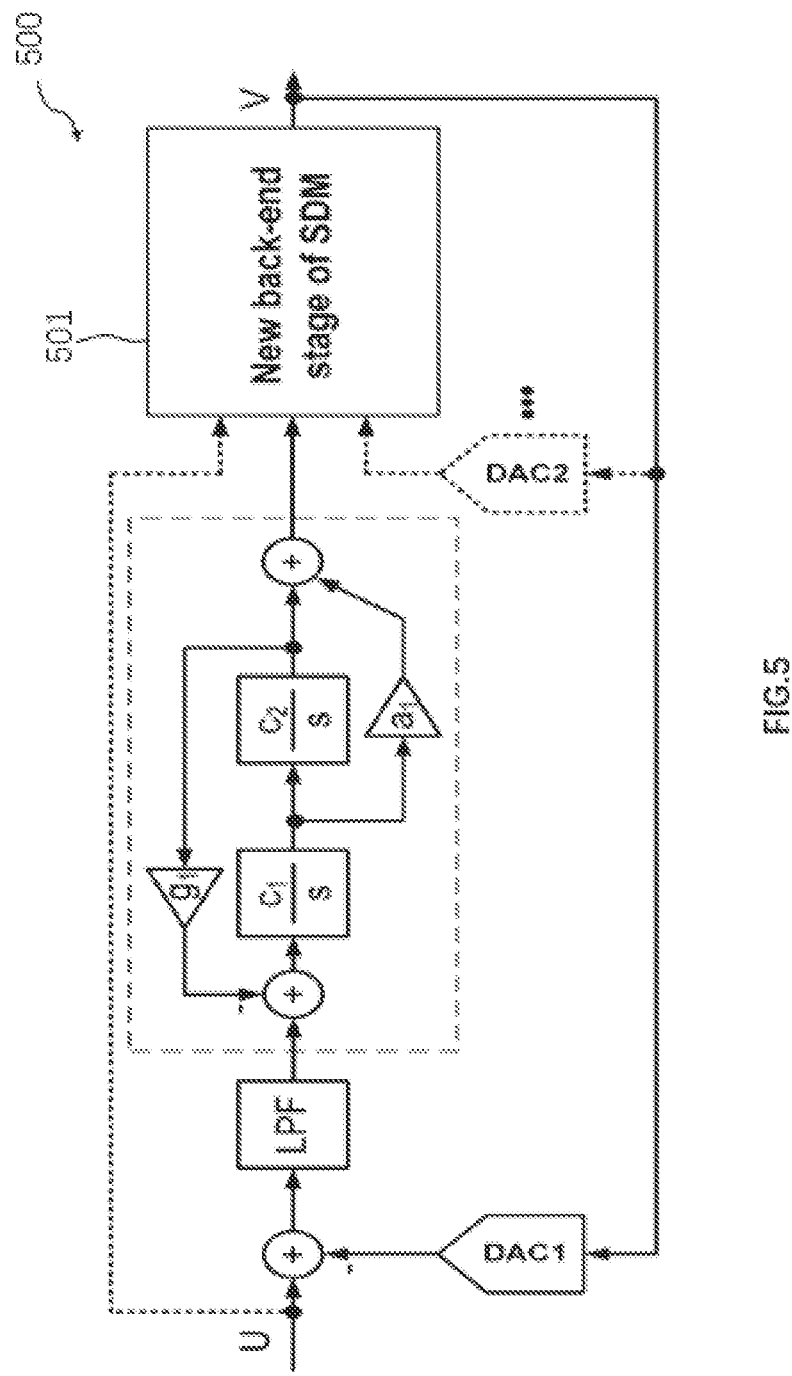
FIG. 5 illustrates a schematic block diagram of an SDM architecture with a low pass filter, a high pass filter considered to be part of the new backend stage in accordance with an embodiment of the present application.
Figure 6:
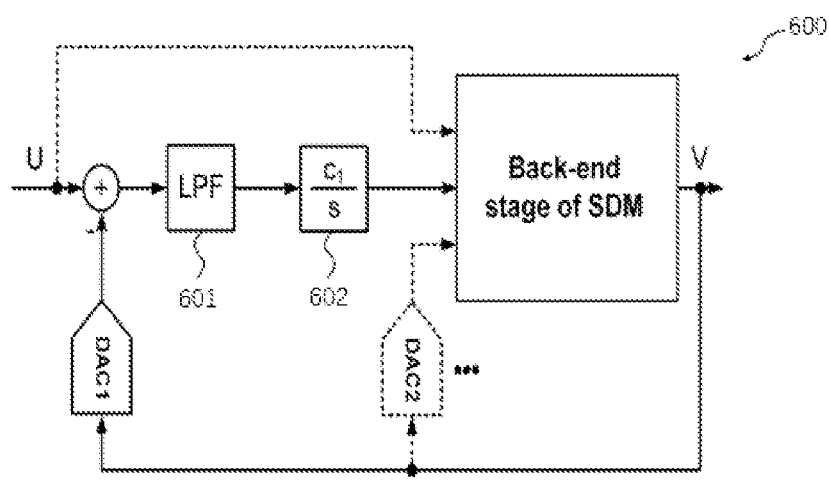
FIG. 6 illustrates a schematic block diagram of an SDM architecture with a low pass filter, an integrator in accordance with an embodiment of the present application.
Figure 7:
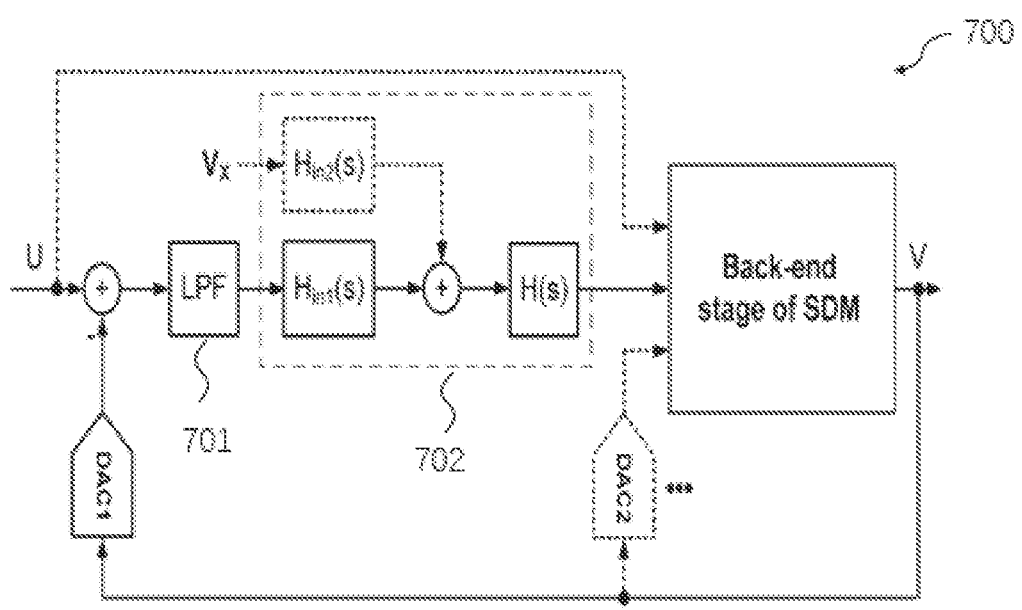
FIG. 7 illustrates a schematic block diagram of an SDM architecture with a low pass filter in accordance with an embodiment of the present application.

To cover as much as possible different cases on the implementation of this invention, three scenarios on the SDM architecture will be described: (1) Sigma-Delta SDM with single-OpAmp resonator, as shown in FIG. 5, 8, 9; (2) Sigma-Delta SDM with active resistance capacitance (active RC) integrator, as shown in FIG. 6, 10, 11; (3) Sigma-Delta SDM with a general filtering and summation circuit with an amplifier, as shown in FIG. 7, 12, 13. In the present context, "active RC integrator" means the RC integrator comprising at least one amplifier. The signal at the amplifier of the second stage is chopped to reduce its low frequency noise. Since the high-frequency quantization noise is filtered by the front-end low-pass filter, aliasing may be strongly suppressed, avoiding an increase of the in-band noise floor and spurs.

Figure 4B:
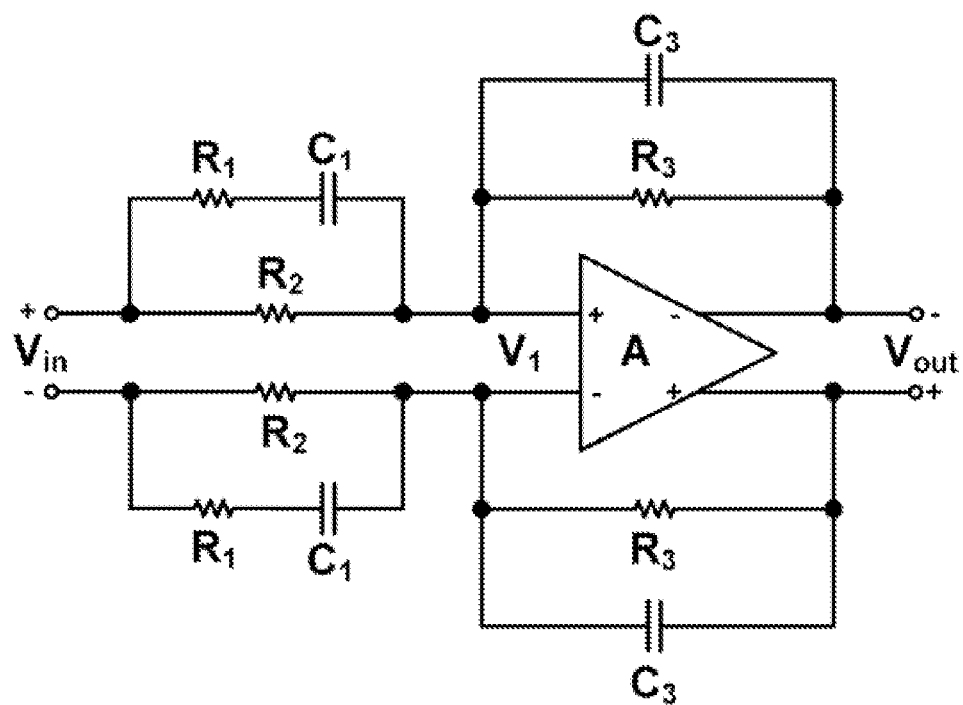
FIG. 4B illustrates an exemplary implementation of a HPF.

In order to restore a desired loop filter transfer function, a high-pass filter (HPF) 418 may be included in the block diagram of the exemplary SDM. In one embodiment, the new block diagram of a SDM architecture with the added HPF is shown in FIG. 4A where the HPF 418 may be coupled between the second stage and the back-end stage of the SDM. FIG. 4B shows an exemplary implementation of the HPF.

Here, to guarantee that the loop filter transfer function of the circuit of FIG. 4A is equivalent to the transfer function of the circuit in FIG. 3, The requirement on the LPF and HPF may be:

$$LPF(s) \cdot HPF(s) = 1 \qquad \text{Eq. 1}$$

Here, LPF(s) is the transfer function of the low-pass filter, and HPF(s) is the transfer function of the high-pass filter.

The functionality of the high-pass filter may be implemented together with the other building blocks of the back-end stage of the SDMs. In other embodiments, the HPF doesn't need to be directly after the second stage (such as a single-OpAmp resonator). For simplicity, the HPF is considered as part of the back-end stage of the SDMs in the following discussion as shown in FIG. 5-FIG. 13.

FIG. 5 illustrates a schematic block diagram of a SDM architecture 500. The SDM architecture 500 is similar to the SDM 400 described previously with reference to FIG. 4A, but with a high pass filter considered to be part of the 501, so will not be described in detail.

FIG. 6 illustrates a schematic block diagram of a SDM architecture 600. The SDM architecture 600 is similar to the SDM 500 described previously with reference to FIG. 5. FIG. 6 shows an example SDM architecture with a LPF 601 as the first stage and an integrator 602 as the second stage.

FIG. 7 illustrates a schematic block diagram of a SDM architecture 700. The SDM architecture 700 is similar to the SDM 500 described previously with reference to FIG. 5. FIG. 7 shows an exemplary SDM architecture with a low pass filter 701 as the first stage and a general filtering and summation function that can be implemented with one amplifier and some RC network as the second stage 702.

Figure 8:
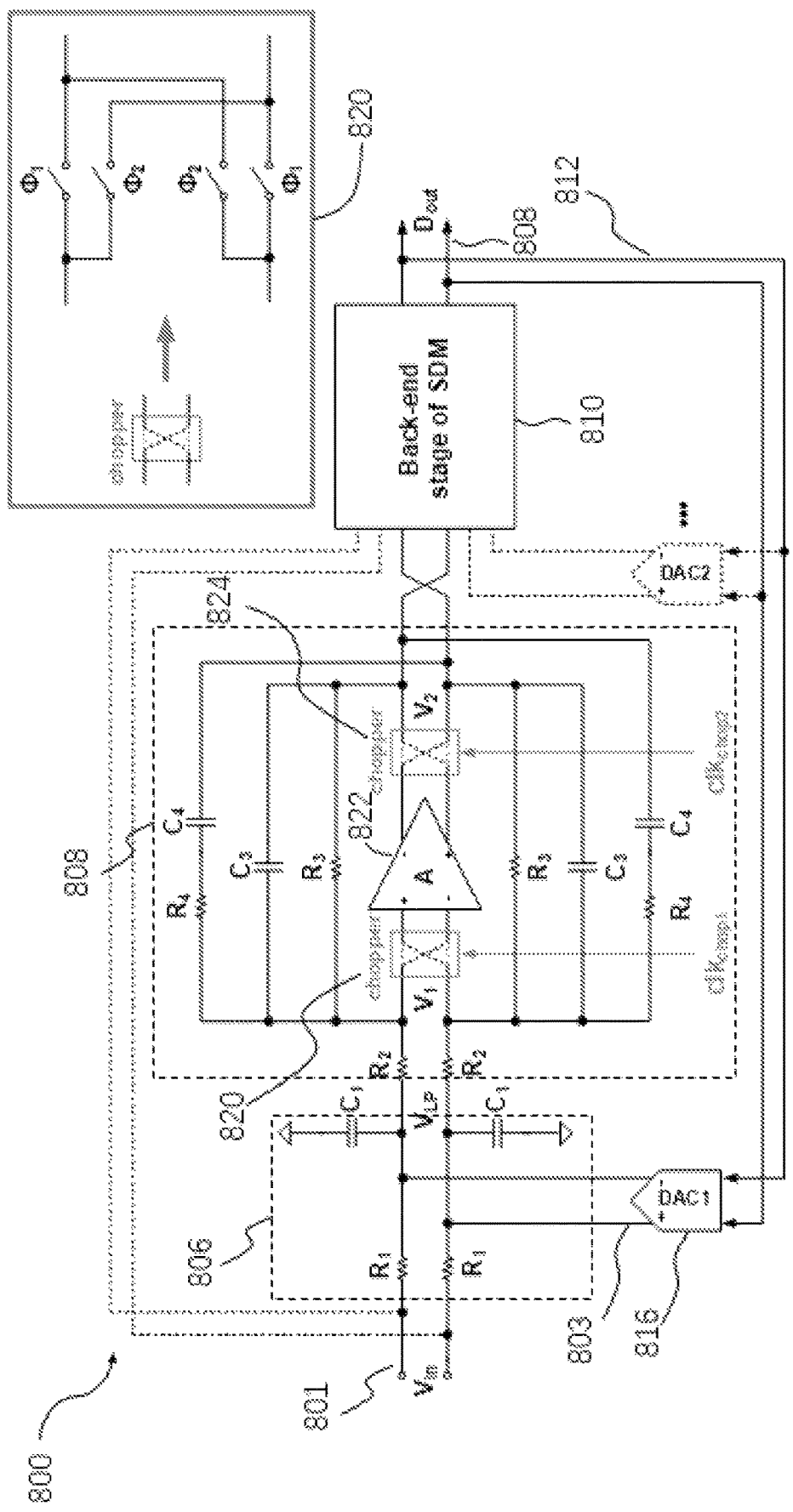
FIG. 8 illustrate an example circuit implementation of a SDM of FIG. 5 in accordance with an embodiment of the present application.
Figure 9:
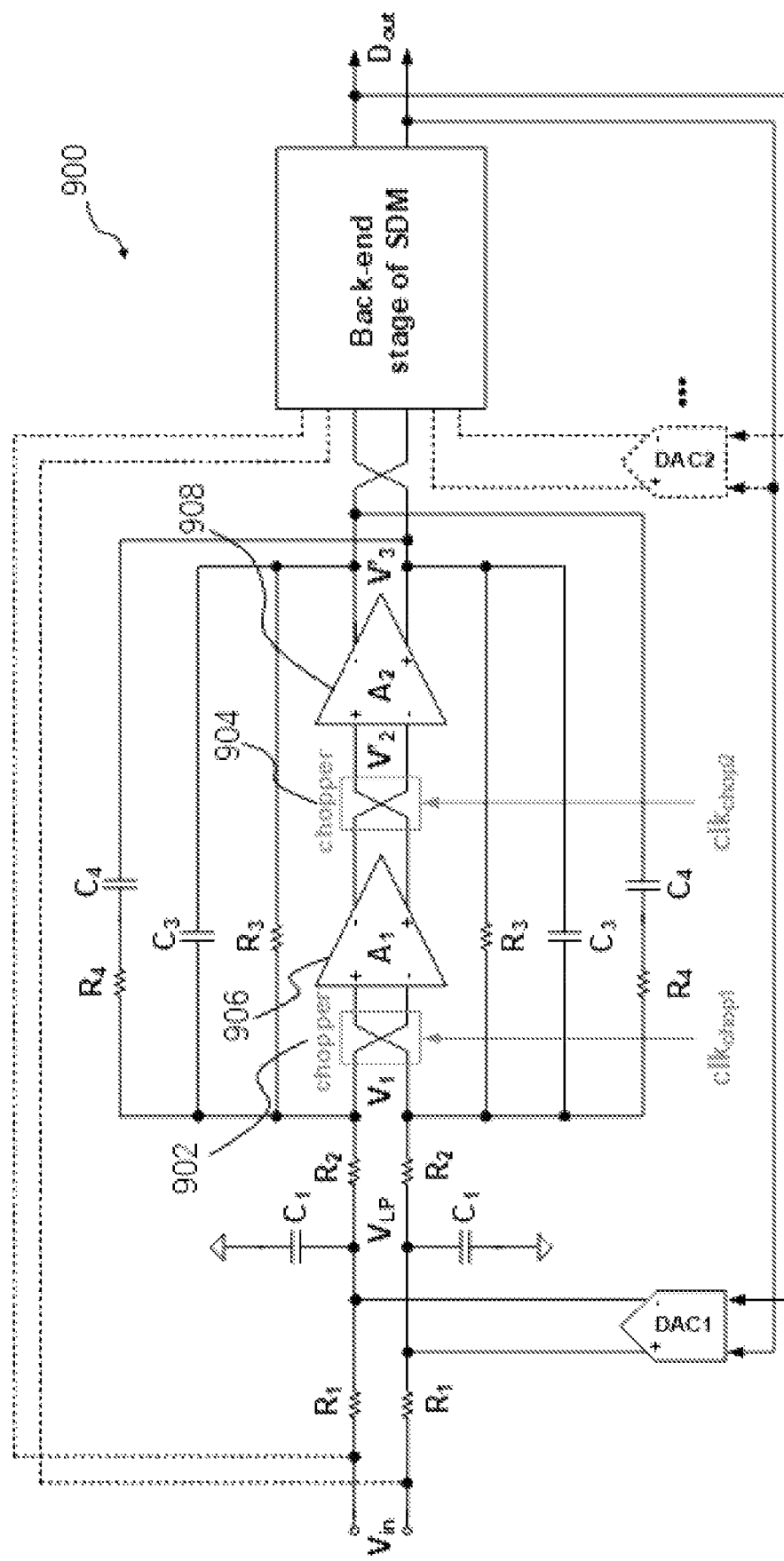
FIG. 9 illustrate another example circuit implementation of a SDM of FIG. 5 in accordance with an embodiment of the present application.

FIG. 8 and FIG. 9 illustrate example circuit implementations of the SDM of FIG. 5, implemented as differential architectures. FIG. 8 and FIG. 9 shows the implementation diagrams of the proposed SDM with a passive RC low-pass filter as the first stage and a single-OpAmp resonator with chopping as the second stage. R1 and C1 form a passive low-pass filter. Normally the pole frequency of the passive LPF should be higher than the signal bandwidth, but much lower than Fs/2. Thus, high-frequency quantization noise which may include idle tones from the DAC feedback is suppressed by this LPF. R2, R3, R4, C3, C4 and the chopper stabilized amplifier form a single-OpAmp resonator.

In one embodiment, the choppers can be put at the amplifier's input nodes (V1) and output nodes (V2) as shown in FIG. 8. In this embodiment, sigma-delta modulator (SDM) utilizes a differential architecture that includes a single-opamp resonator that outputs differential signals that are substantially the same in magnitude and substantially opposite in polarity. As seen in FIG. 8, SDM 800 includes an differential input to receive a differential analog input signal Vin 801 from which is subtracted a differential feedback signal 803 from a main DAC 816 and filtered by a differential passive low pass filter (LPF) 806 to produce a filtered differential signal. The LPF 806 may include resistors R1 and capacitors C1. To realize a pole frequency $f_p$, $R_1$ and $C_1$ may be calculated as $f_p=1/(2*n*R_1*C_1)$. The value of $R_1$ is further limited by its thermal noise. The resistor R1 may be coupled between the input of the SDM and the output of the main DAC 816. The capacitor C1 may be coupled between the output of the main DAC 816 and the ground. The single-opamp resonator 808 illustrates the circuit construction of the amplifier where the signal is chopped. The differential signal filtered by the LPF 806 is chopped at a chopping frequency ($clk_{chop1}$) at input nodes V1 of the amplifier 822 by a first chopper 820. The chopped signal from the first chopper 820 is amplified by the amplifier 822 and then is chopped again at the output nodes V2 of the amplifier 822 at a second chopping frequency ($clk_{chop2}$) by a second chopper 824 to produce a second filtered signal which serves as the input of the back-end stage 810. The first chopping frequency (clkchop1) and the second chopping frequency (clkchop2) may be the same and may be 1/N times of a predetermined ADC sampling frequency. The value of N is a whole number greater than 1, and may be as large as 8. The back-end stage 810 may include a quantizer or an analog to digital converter (ADC) coupled to the output of the single-opamp resonator 808, configured to convert the second filtered signal to a digital output signal $D_{out}$ by sampling at the predetermined sampling frequency (fs). A feedback path 812 comprises a plurality of digital to analog converters configured to convert the digital output signal to analog forms.

There are a wide variety of conventional chopping switches that may be used. In the insert in FIG. 8, the first chopper 820 or the second chopper 824 is expanded to illustrate a typical circuit construction which may include four switches clocked by two clocks Φ1 and Φ2. The two clocks Φ1 and Φ2 may be complimentary or non-overlapping clocks.

The low-frequency noise and the noise around the chopping frequency can be interchanged, which means the chopping operation upconverts the low-frequency noise to the chopping frequency and downconverts the noise at the chopping frequency to low frequency. However, V2 nodes are the resonator output nodes. The voltage swing of the V2 nodes is normally quite large (e.g. around ±0.5V) for noise reason. In this application, a very high chopping frequency may be used, e.g. Fs/2. Fs may be as high as a few GHz for broadband Sigma-Delta ADCs. Thus, the chopper has only a few hundred ps to settle, and the large swing at V2 nodes may lead to a relatively stringent requirement on the settling speed of the chopper. The imperfect settling of the chopper may limit the linearity of the ADC; other embodiments may avoid this relatively stringent requirement.

In one such other embodiment, to reduce the voltage swing at the chopping nodes, two gains stages may be used, the choppers can be put at the input nodes of each of the gain stages, as shown in FIG. 9. FIG. 9 shows an embodiment of SDM with a single-OpAmp resonator, with a chopper stabilized amplifier. Here, we can consider the first chopper 902, the first amplifier 906, the $2^{nd}$ chopper 904, and the $2^{nd}$ amplifier 908 together as a "chopper stabilized amplifier". For the amplifier implementation, it is a common technique to use multi-stage amplifier, e.g. cascading of an amplifier stage $A_1$ with an amplifier stage $A_2$. Here, we consider the amplifier is implemented with two gain stages A1 and A2. We can put the first choppers at the input node V1 of the first gain stage A1, and second chopper at a node V'2 between the two gain stages. The voltage swing at V'2 is suppressed by the gain of A2 compared to the resonator output node V'3. Thus, the requirement on the chopper is relaxed compared to FIG. 8. Notice that in FIG. 9, only the flicker noise of the first gain stage A1 is chopped, while the flicker noise of the second gain stage A2 is not chopped. However, the flicker noise originating from A2 is suppressed by the gain of A1 when referred to the SDM input, and can thus be designed to be not dominant.

Figure 10:
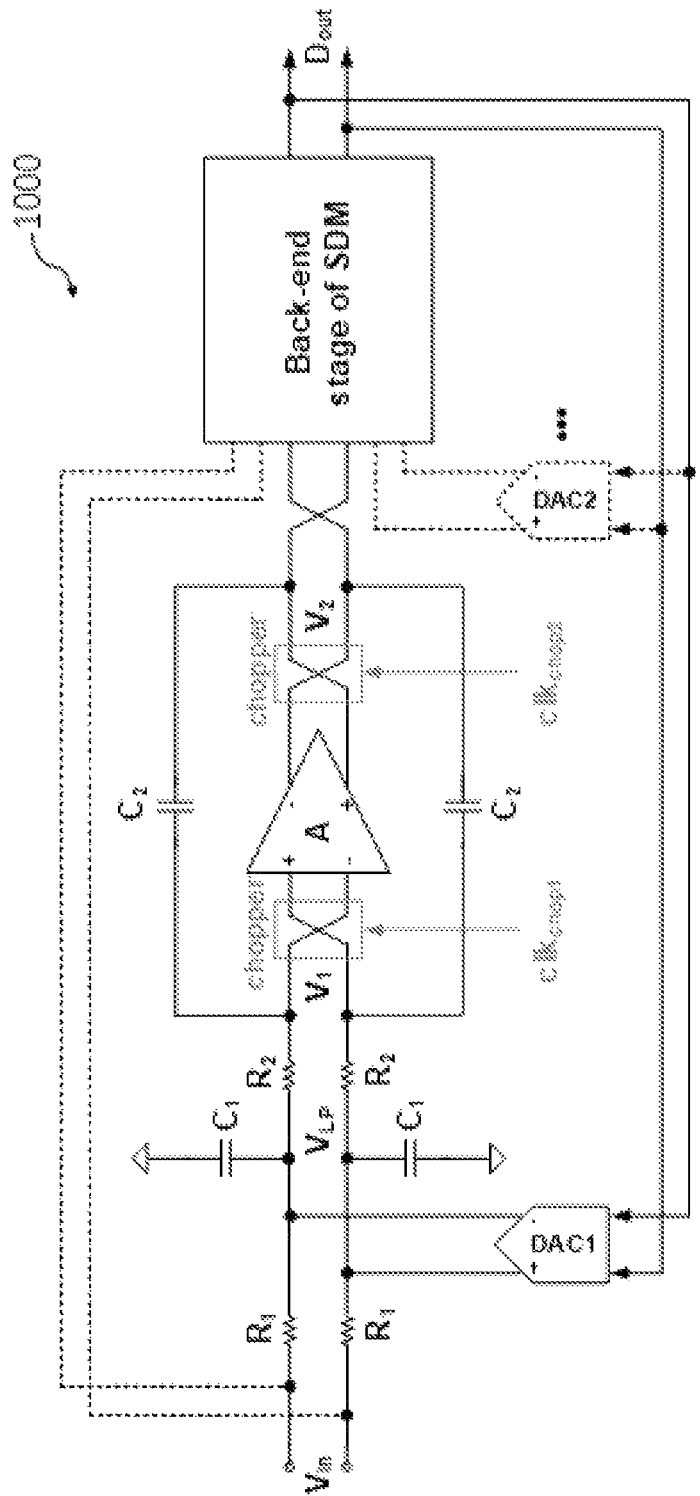
FIG. 10 illustrate example circuit implementations of a SDM of FIG. 6 in accordance with an embodiment of the present application.
Figure 11:
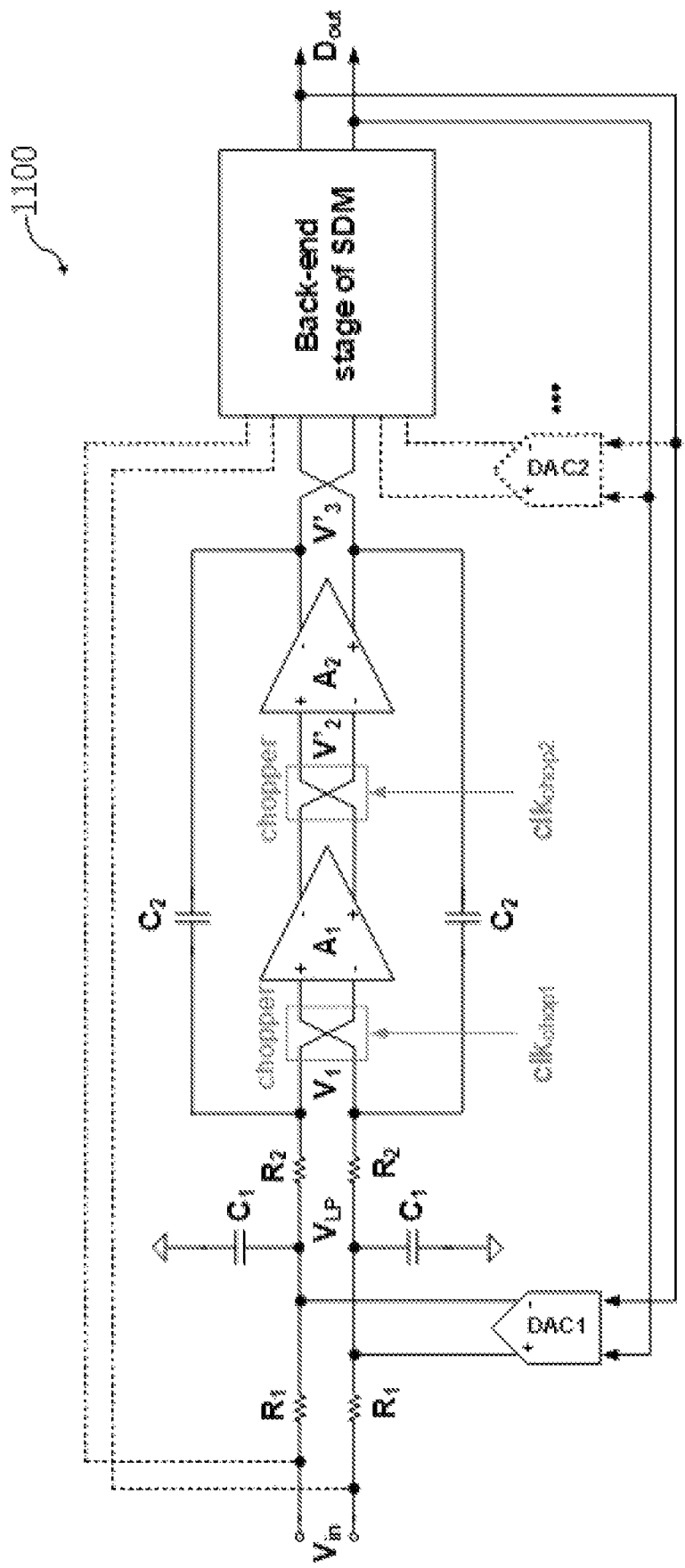
FIG. 11 illustrate another example circuit implementations of a SDM of FIG. 6 in accordance with an embodiment of the present application.

FIG. 10 and FIG. 11 illustrate example circuit implementations of a SDM of FIG. 6. FIG. 10 and FIG. 11 are similarly to FIG. 8 and FIG. 9, respectively, except that FIG. 10 and FIG. 11 show the implementation diagrams of the proposed SDM with a passive RC low-pass filter and an active RC integrator with chopping. R2, C2 and the chopper stabilized amplifier form the active RC integrator. For the amplifier used in the active RC integrator, the choppers may be put in or put around the amplifier.

In one embodiment, as shown in FIG. 10, the choppers may be put at the input node V1 of the single gain stage A, and output node V2 of the single gain stage A.

In another embodiment, as shown in FIG. 11, the choppers may be put at the A1 input node V1, and the nodes V'2 between two gain stages A1 and A2.

Figure 12:
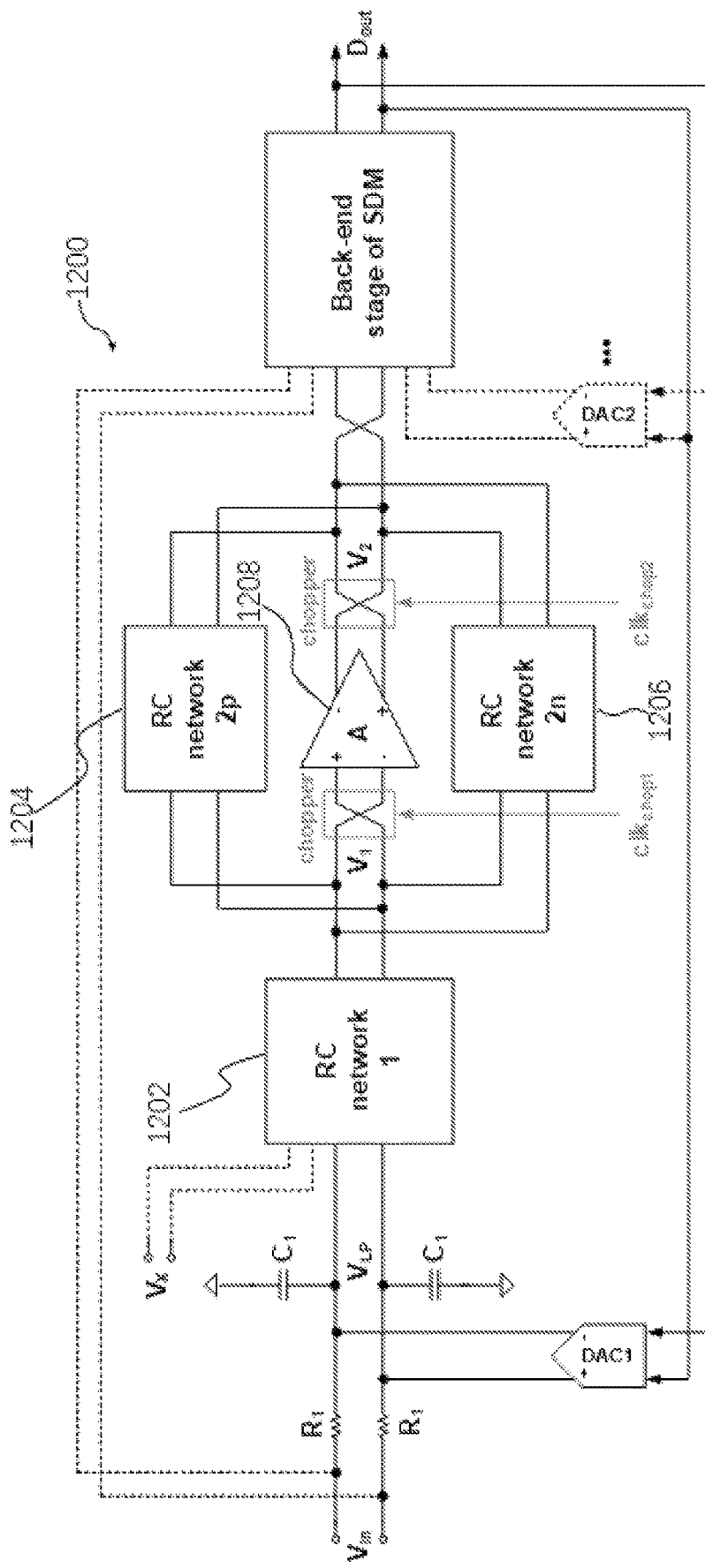
FIG. 12 illustrate an example circuit implementations of a SDM of FIG. 7 in accordance with an embodiment of the present application.
Figure 13:
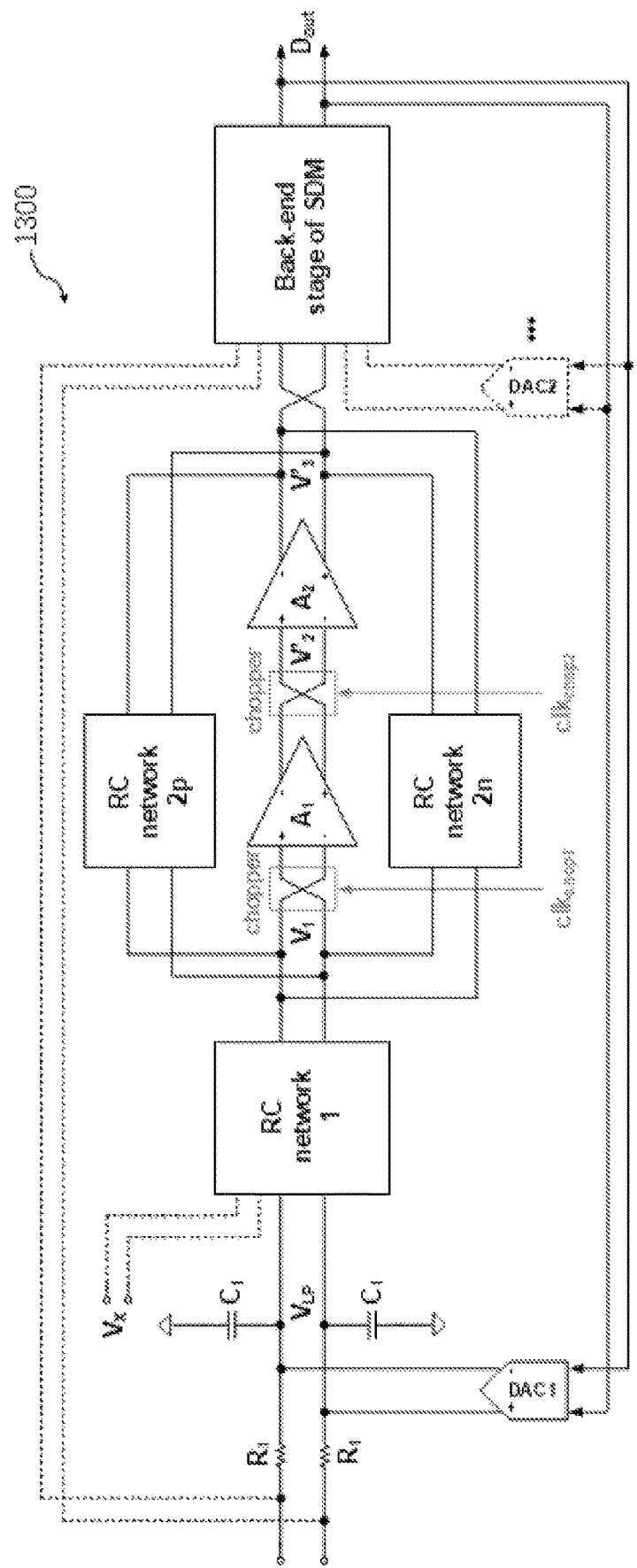
FIG. 13 illustrate another example circuit implementations of a SDM of FIG. 7 in accordance with an embodiment of the present application.

FIG. 12 and FIG. 13 illustrate example circuit implementations of a SDM of FIG. 7. FIG. 12 and FIG. 13 shows the implementation diagrams of the proposed SDM with a passive RC low-pass filter as the first stage, and a general filtering and summation structure. The general filtering and summation structure include an RC network 1, 1202, RC network 2p/2n, 1204/1206 and an amplifier A 1208. The general filtering and summation structure form the second stage of the SDM. For the amplifier used in the general filtering and summation circuit, the choppers may be put in or put around the amplifier.

In one embodiment, as shown in FIG. 12, the choppers may be put at the input node V1 of the single gain stage A, and its output nodeV2.

In one embodiment, as shown in FIG. 13, the choppers may be put at the A1 input node V1, and the node V'2 between the two gain stages A1 and A2.

In one embodiment, the feedback DAC (e.g. DAC1) may be a finite impulse response (FIR) DAC.

In other embodiments, the feedback DAC (e.g. DAC1) is not a FIR DAC.

In one embodiment (not shown), the low-pass filter (LPF) output can be used as an input for the back-end stage of the SDMs. Some extra feedforward paths can be added in the SDM, such that the loop filter transfer function is equivalent to the transfer function of FIG. 3, and the HPF is not needed.

Figure 14:
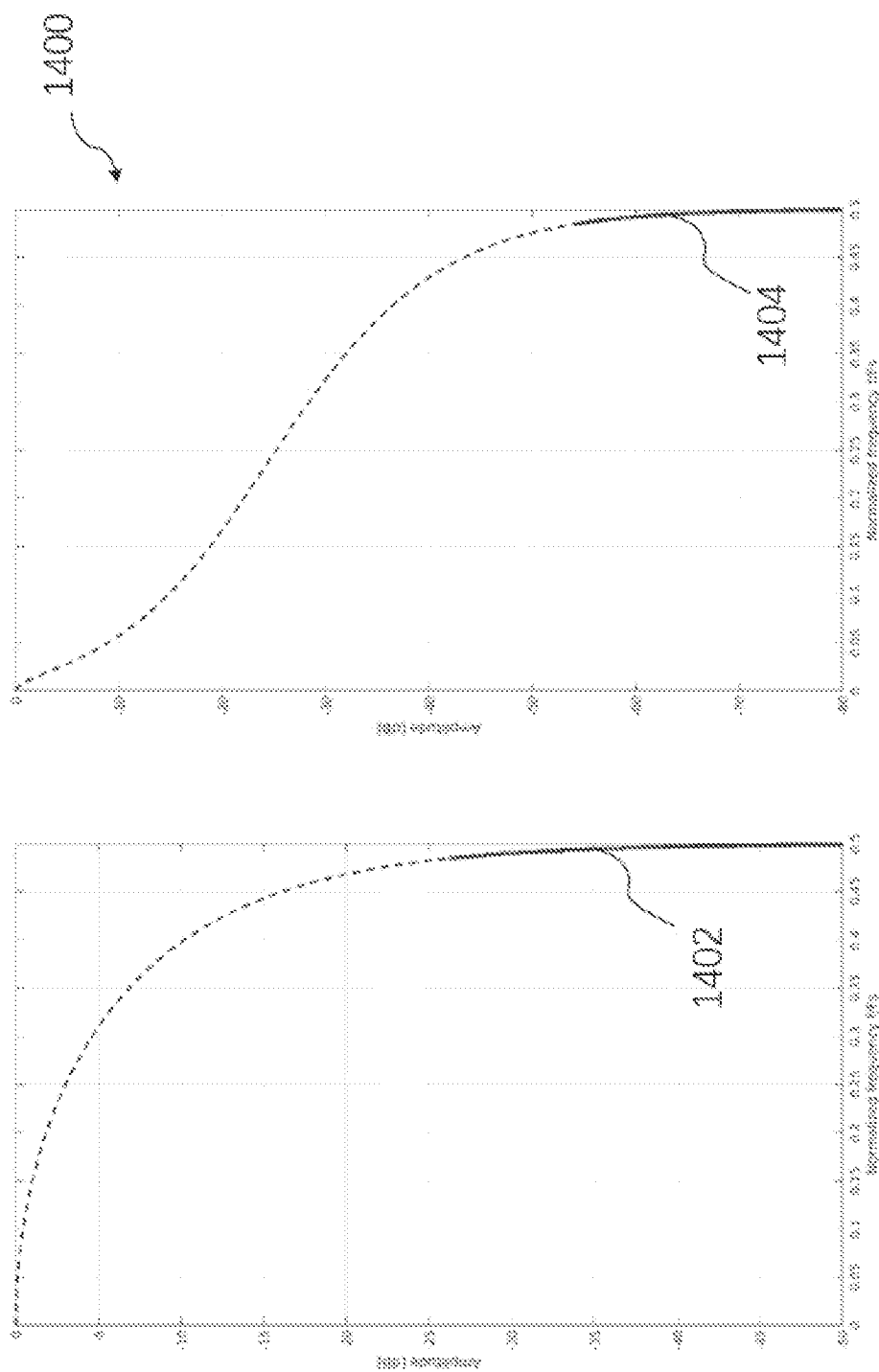
FIG. 14 illustrate diagrams of comparison the band which can be aliased into the signal band with and without the input low-pass filter.

FIG. 14 compares the band which can be aliased into the signal band with and without the input low-pass filter in case of oversampling ratio (OSR)=32, when DAC1 is implemented as a 2-tap finite impulse response (FIR) DAC, the second stage of the SDM loop filter comprises a chopper stabilized amplifier operated at half of the SDM sampling frequency Fs, and the chopping clock is nonideal, e.g. the clocks controlling the chopper switches are skewed or exhibit a duty cycle error. The left figure shows the magnitude of the transfer function of the 2-tap FIR DAC plotted against frequency. The line 1402 depicts the band that can be aliased into the signal band when the clocks controlling the chopper switches are nonideal. The right figure shows the magnitude of the transfer function of the 2-tap FIR DAC combined with the transfer function of an analog input low-pass filter, plotted against frequency. The line 1404 depicts the band that can be aliased into the signal band when the clocks controlling the chopper switches are non-ideal. The input low-pass filter increases the suppression of high-frequency quantization noise and spurs by 27 dB.

Figure 15:
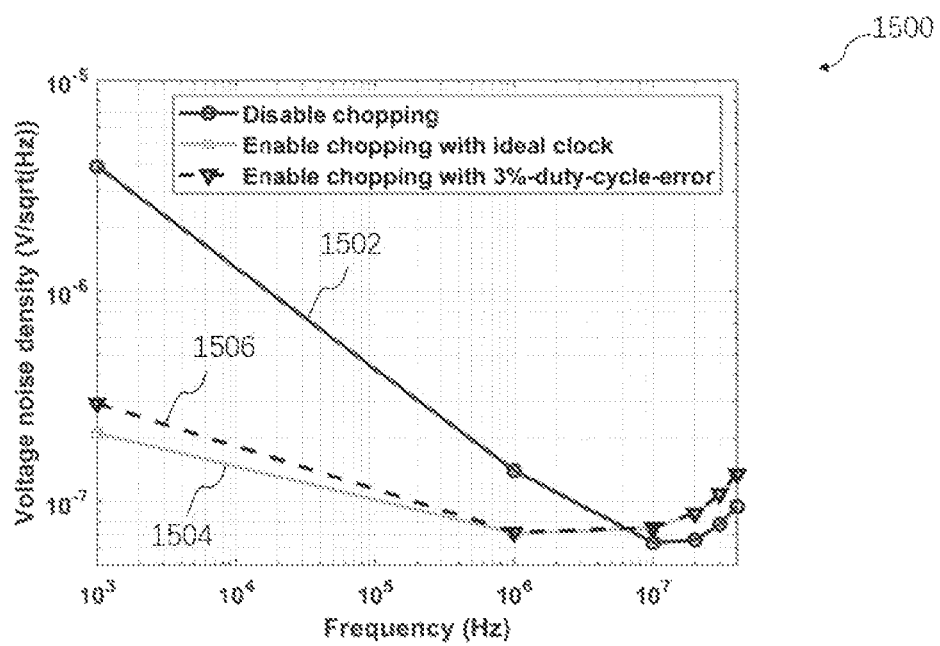
FIG. 15 illustrate a diagram of simulated voltage noise density (post-layout) with chopping enabled and disabled.

FIG. 15 shows the simulated SDM input referred voltage noise density with a circuit implementation of the system in FIG. 9. The figure shows the voltage noise density plotted against frequency of the ADC input on the x-axis. The loop filter, including the passive low-pass filter, the single-OpAmp resonator with chopping etc. may be implemented at layout level. Post-layout extracted model is used in this Pnoise simulation. The simulated voltage noise density of three conditions are compared: (1) chopping disabled, shown at 1502 (2) chopping enabled with an ideal clock at 1504 (3) chopping enabled with a non-ideal clock, where 3% duty cycle error of the chopping clock is applied at 1506. Comparing the chopping disabled with chopping enabled with an ideal clock, it shows that the chopping can reduce the low frequency (1 kHz-1 MHz in this figure) noise density significantly. The voltage noise density at 1 kHz is reduced from 3.91 uV/√Hz to 211 nV/√Hz by chopping, which is 18.5×. The noise density in the frequency band 10 MHz-40 MHz is increased slightly, because of folding back high frequency quantization noise and chopper non-idealities. Comparing the chopping enabled with an ideal clock with chopping enabled with a non-ideal clock, 3% of chopping clock duty cycle error slightly degrades the noise density at 1 kHz from 211 nV/√Hz to 293 nV/√Hz, but it is still 13.3× lower than the unchopped noise density.

Figure 16:
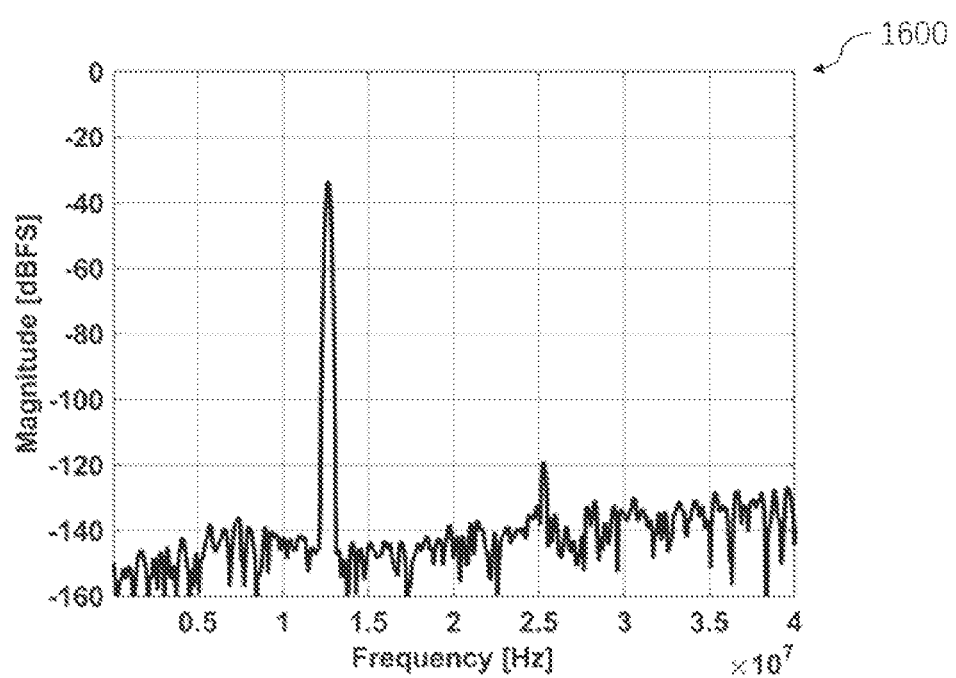
FIG. 16 illustrate a diagram of simulated output spectrum due to loop filter non-linearity with loop filter schematic and chopping enabled.

FIG. 16 shows the simulated output spectrum of the Sigma-Delta ADC with the proposed passive LPF and the chopping enabled. The figure shows, on the y-axis the simulated output spectrum plotted against frequency of ADC output on the x-axis. The loop filter is implemented at schematic level. In this figure, the spectrum due to the loop filter non-linearity is shown after post-processing in Matlab (the quantization noise of the SDM is cancelled). With a −34 dBFS single-tone input, the simulated in-band spur level due to loop filter non-linearity is −118 dBFS in the worst PVT condition. Without the proposed passive LPF, the in-band spur level for the same condition is about −90 dBFS. Simulation results shows that the proposed passive LPF reduces the in-band spur level by about 28 dB, which is in-lined with the additional suppression of at least 27 dB on the tones within (Fs/2-40 MHz, Fs/2) offered by the LPF (shown in FIG. 14). Simulation results confirms the effectiveness of the present application.

Figure 17:
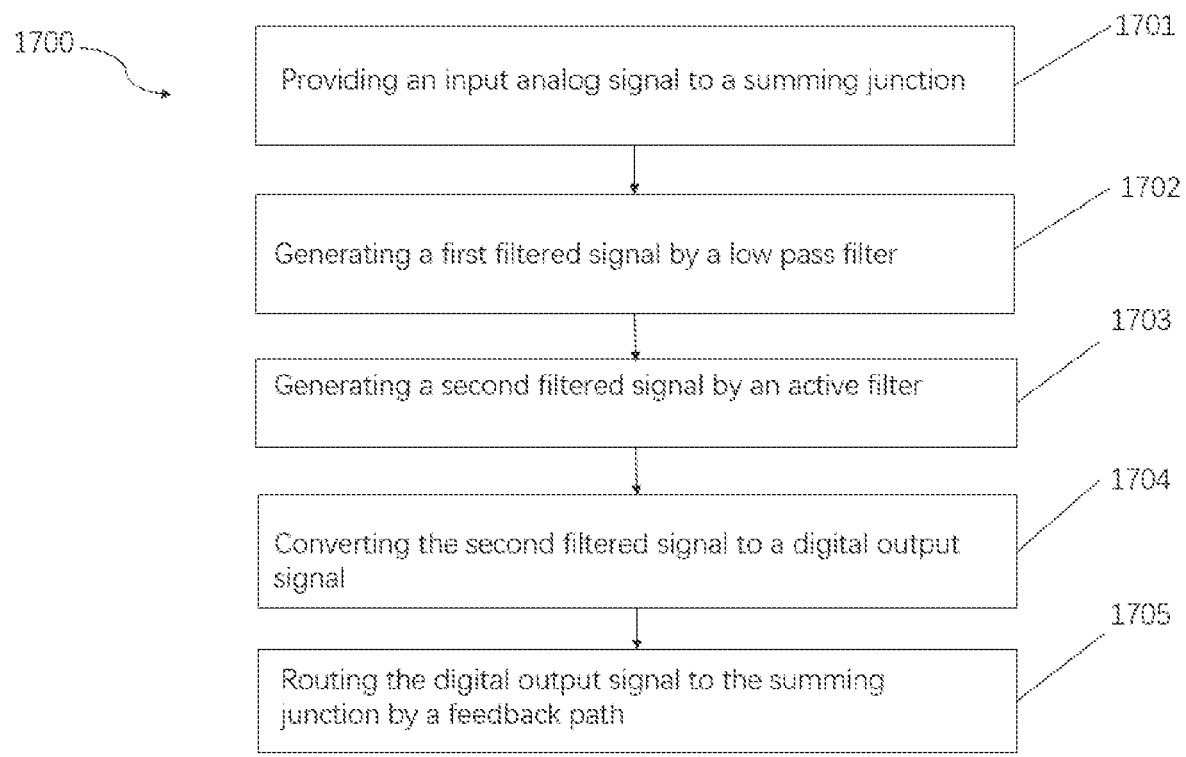
FIG. 17 illustrate a flowchart of converting an analog signal to a digital signal in accordance with an embodiment of the present application.

FIG. 17 illustrates a flowchart of a method for converting an analog signal to a digital signal in accordance with one or more embodiments of the present application. At step 1701, providing an input analog signal to a summing junction which is coupled to an input of a sigma delta modulator. The summing junction is configured to subtract a feedback analog signal from the input analog signal. At step 1702, generating a first filtered signal by a low pass filter which is coupled to the summing junction. In one embodiment, the low pass filter is a passive low pass filter. At step 1703, generating a second filtered signal by an active filter. In one embodiment, generating a second filtered signal by an active filter including chopping the signal at at least one chopper stabilized amplifier of the active filter at a chopping frequency which is 1/N times of the predetermined sampling frequency (fs). In another embodiment, the active filter is a single-OpAmp resonator or an integrator. In another embodiment, the second filtered signal is further filtered by a high pass filter. At step 1704, converting the second filtered signal to a digital output signal by sampling at the predetermined sampling frequency (fs). At 1705, routing the digital output signal to the summing junction by a feedback path where the digital output signal is fed to a digital to analog converter to convert the digital output signal to the feedback analog signal. Then the analog form of the digital output signal is fed to the summing junction.

Thus, the present invention provides a continuous-time sigma delta modulator and a method for converting an analog input signal to a digital signal by using a low pass filter combined with at least one chopper stabilized amplifier for low flicker noise and high linearity.

Although the operations of the method herein are shown and described in a particular order, the order of the operations of the method may be altered so that certain operations may be performed in an inverse order or so that certain operations may be performed, at least in part, concurrently with other operations.

"Sigma-delta modulators" are also commonly referred to using other interchangeable terms such as "delta-sigma modulators", "delta-sigma converters", "sigma delta converters", "Sigma-delta ADC", "Delta-Sigma ADC" and "noise shapers". "Sigma delta modulator" and "delta-sigma modulator" are interchangeable terms for the purpose of this specification.

Referring now to the use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the application as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A sigma delta modulator, comprising:
an input configured to receive an input analog signal;

a summing junction coupled to the input, configured to subtract a feedback analog signal from the input analog signal;

a first stage including a low pass filter coupled to the summing junction, wherein the low pass filter is configured to generate a first filtered signal;

a second stage including includes a single-OpAmp resonator, the second stage coupled to the low pass filter and configured to generate a second filtered signal by an active filter, wherein the active filter comprises at least one amplifier where the first filtered signal is chopped at a chopping frequency which is 1/N times of a predetermined sampling frequency;

a back-end stage coupled to the second stage, wherein the back-end stage comprises an analog to digital converter configured to convert the second filtered signal to a digital output signal by sampling at the predetermined sampling frequency; and a feedback path for routing the digital output signal to the summing junction, wherein the feedback path comprises a digital to analog converter, DAC, converting the digital output signal to the feedback analog signal.

2. The sigma delta modulator as claimed in claim 1, wherein the low pass filter is a passive low pass filter.

3. The sigma delta modulator as claimed in claim 1, further comprising a high pass filter coupled between the second stage and the back-end stage.

4. The sigma delta modulator as claimed in claim 1, further comprising a path where the output of the low pass filter is coupled to the input of the back-end stage.

5. The sigma delta modulator as claimed in claim 1, wherein the single-OpAmp resonator further comprises a first and a second chopper, wherein the first chopper is coupled at the input of the amplifier and the second chopper is coupled at the output of the amplifier.

6. The sigma delta modulator as claimed in claim 1, wherein the single-OpAmp resonator further comprises a first chopper, a second chopper, a first amplifier and a second amplifier, wherein the first chopper is coupled at the input of the first amplifier and the second chopper is coupled between the first amplifier and the second amplifier.

7. The sigma delta modulator as claimed in claim 1, wherein the second stage includes an integrator.

8. The sigma delta modulator as claimed in claim 7, wherein the integrator further comprises a first chopper, an amplifier and a second chopper, wherein the first chopper is coupled at the input of the amplifier and the second chopper is coupled at the output of the amplifier.

9. The sigma delta modulator as claimed in claim 7, wherein the integrator further comprises a first chopper, a second chopper, a first amplifier and a second amplifier, wherein the first chopper is coupled at the input of the first amplifier and the second chopper is coupled between the first amplifier and the second amplifier.

10. The sigma delta modulator as claimed in claim 1, wherein the second stage further includes a first RC network coupled between the low pass filter and the amplifier, a second RC network coupled between the input of the amplifier and the output of the amplifier, and a third RC network coupled between the input of the amplifier and the output of the amplifier.

11. The sigma delta modulator as claimed in claim 10, wherein the second stage further comprises a first chopper and a second chopper, wherein the first chopper is coupled at the input of the amplifier and the second chopper is coupled at the output of the amplifier.

12. The sigma delta modulator as claimed in claim 10, wherein the second stage further comprises a first chopper, a second chopper, a first amplifier and a second amplifier, wherein the first chopper is coupled at the input of the first amplifier and the second chopper is coupled between the first amplifier and the second amplifier.

13. The sigma delta modulator as claimed in claim 1, wherein the digital to analog converters includes main digital to analog converter coupled to the summing junction and the low pass filter includes a resistor and a capacitor, wherein the resistor is coupled between the input of the sigma delta modulator and the output of the digital to analog converter, and the capacitor is coupled between the output of the main digital to analog converter and the ground.

14. The sigma delta modulator as claimed in claim 1, wherein the digital to analog converter is a finite impulse response (FIR) DAC.

15. A method for converting an analog input signal to a digital signal, the method comprising:
    receiving an input analog signal;
    subtracting a feedback analog signal from the input analog signal in a summing junction to produce a subtracted signal;
    filtering the subtracted signal to generate a first filtered signal by a low pass filter;
    generating a second filtered signal by an active filter, a single-OpAmp resonator, or an integrator;
    converting the second filtered signal to a digital output signal by sampling at a predetermined sampling frequency;
    feeding back the digital output signal to the summing junction via a digital-to-analog converter, DAC, converting the digital output signal to the feedback analog signal.

16. The method as claimed in claim 15, wherein filtering the subtracted signal to generate a first filtered signal by a low pass filter comprises filtering the subtracted signal by a passive low pass filter.

17. The method as claimed in claim 15, further comprising filtering the second filtered signal by a high pass filter.

18. The method as claimed in claim 15, wherein generating a second filtered signal by an active filter comprises chopping the first filtered signal at at least one chopper stabilized amplifier of the active filter at a chopping frequency which is 1/N times of the predetermined sampling frequency.

19. A sigma delta modulator, comprising:
    an input configured to receive an input analog signal;
    a summing junction coupled to the input, configured to subtract a feedback analog signal from the input analog signal;
    a first stage including a low pass filter coupled to the summing junction, wherein the low pass filter is configured to generate a first filtered signal;
    a second stage coupled to the low pass filter and configured to generate a second filtered signal by an active filter, the second stage including a first RC network coupled between the low pass filter and the amplifier, a second RC network coupled between the input of the amplifier and the output of the amplifier, and a third RC network coupled between the input of the amplifier and the output of the amplifier, wherein the active filter comprises at least one amplifier where the first filtered signal is chopped at a chopping frequency which is 1/N times of a predetermined sampling frequency;
    a back-end stage coupled to the second stage, wherein the back-end stage comprises an analog to digital converter configured to convert the second filtered signal to a digital output signal by sampling at the predetermined sampling frequency; and a feedback path for routing the digital output signal to the summing junction, wherein the feedback path comprises a digital to analog converter, DAC, converting the digital output signal to the feedback analog signal.

20. The sigma delta modulator as claimed in claim 19, further comprising a path where the output of the low pass filter is coupled to the input of the back-end stage.

* * * * *